(12) United States Patent
Grenouillet et al.

(10) Patent No.: US 7,691,735 B2
(45) Date of Patent: Apr. 6, 2010

(54) METHOD FOR MANUFACTURING METAL CHIPS BY PLASMA FROM A LAYER COMPRISING SEVERAL ELEMENTS

(75) Inventors: Laurent Grenouillet, Rives (FR); Jonathan Garcia, Monestier du Percy (FR); François Marion, Saint Martin le Vinoux (FR); Nicolas Olivier, Teche (FR); Marion Perrin, Valence (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/254,484

(22) Filed: Oct. 20, 2008

(65) Prior Publication Data
US 2009/0162657 A1 Jun. 25, 2009

(30) Foreign Application Priority Data
Dec. 24, 2007 (FR) .................................. 07 60347

(51) Int. Cl.
*H01L 21/44* (2006.01)
(52) U.S. Cl. ................... 438/612; 438/602; 438/611; 438/718; 257/E21.218; 257/E21.22
(58) Field of Classification Search ................. 438/474, 438/477, 612, 613, 718, 602, 603, 604, 611, 438/597; 977/773, 778, 813, 815, 816, 817, 977/818, 820; 257/E21.218, E21.22
See application file for complete search history.

(56) References Cited
U.S. PATENT DOCUMENTS
5,124,091 A 6/1992 Paliwal et al.
5,346,852 A 9/1994 Gedridge, Jr.
5,865,365 A 2/1999 Nishikawa et al.
6,362,087 B1 * 3/2002 Wang et al. ................. 438/597

FOREIGN PATENT DOCUMENTS
EP 1043766 A1 10/2000

OTHER PUBLICATIONS

Republic of France International Search Report dated Jul. 1, 2008 (2 pgs.).
IEEE Transactions on Components, Packaging, and Manufacturing Technology, Part A, vol. 21, No. 2, June 1998, Overview of Conductive Adhesive Interconnection Technologies for LCD's, Helge Kristiansen and Johan Liu, Senior Member, IEEE, pp. 208-214.
J. Phys. F: Metal Phys., vol. 2, May 1972. Printed in Great Britain, The melting of small particles of lead and indium, CJ Coombes, Department of Physics, Imperial College of Science and Technology, London SW7, UK, pp. 441-449.

* cited by examiner

*Primary Examiner*—Julio J Maldonado
(74) *Attorney, Agent, or Firm*—Marjama Muldoon Blasiak & Sullivan LLP

(57) ABSTRACT

The invention relates to a method for manufacturing chips composed of at least one electrically conductive material. Such a method comprises the following steps:
- deposition, on a support, of an alloy comprising at least the electrically conductive material and a second material;
- exposure of the alloy to plasma etching, in order to cause the desorption of the materials of the alloy not forming part of the composition of the chips, that is at least the second material but not the electrically conductive material;
- formation of chips composed of at least said electrically conductive material.

9 Claims, 8 Drawing Sheets

15 μm pitch Indium bumps field ical Vapor Deposition (CVD), advantageously at low temperature (between 100 and 250° C.) as reported in document U.S. Pat. No. 5,346,852.
METHOD FOR MANUFACTURING METAL CHIPS BY PLASMA FROM A LAYER COMPRISING SEVERAL ELEMENTS

CROSS REFERENCE TO RELATED APPLICATIONS

This application claims priority under 35 U.S.C. §119 from French Patent Application No. 0760347 filed on Dec. 24, 2007 in the French Patent Office, the entire disclosure of which is incorporated herein by reference.

FIELD OF THE INVENTION

The present invention relates to the manufacture of metal flip-chips, having both small size and high density.

Such chips have applications in particular in the field of packaging optoelectronic and/or microelectronic components.

More precisely, the inventive method is based on the use of an alloy, which is at least binary.

BACKGROUND OF THE INVENTION

In the field of micro- and nanotechnologies, the trend is to reduce the size of the components and to increase their integration density. This trend must necessarily be followed by the interconnection technologies (conductive films and adhesives, flip-chips (1), etc.), for which the pitches are increasingly small.

A first example relates to the flip-chip which is a highly advantageous technique for hybridizing components, for example on read circuits (FIG. 1). Compared with other techniques such as wire-bonding, it serves to obtain a high interconnection efficiency and to make the components operate at high frequency. Moreover, this collective technique serves to obtain a self-alignment of the components (FIG. 2).

The present method for producing indium chips is illustrated in FIG. 3. The quantity of material required for the formation of the indium chip is deposited by lift off on a metal bump, and the board is then heated to a sufficient temperature to remelt the indium: the metal then assumes its chip shape.

This embodiment involves a delicate technological step, lift off, which requires the use of thick resins and a good control of their profile, and also a remelt step to obtain the actual indium chip. The chips have a typical diameter of about 10 μm, with a pitch of 15 μm, as shown in FIG. 1. With this technique, it becomes difficult to obtain smaller chips, with high densities.

For finer pitches and/or smaller chip sizes, other production methods, such as conventional photolithography, with plasma etching of the indium (with a carbon chemistry) or electrolytic growth, are used. However, these embodiments have not reached maturity today.

A second example relates to the field of anisotropic conductive films/adhesives. These adhesives contain particles which, crushed by thermocompression, cause a vertical conduction. In this field, it is also necessary to use increasingly thin films, with increasingly dense interconnections. At present, Anisotropic Conductive Films (ACF) which have the smallest conductive particles are products with 3 μm diameter particles.

The technical problem that the present invention proposes to solve is therefore to provide a method for manufacturing flip-chips having the desired structural characteristics, in particular having a smaller size, and a high density per unit area.

A further object advantageously pursued by the present invention is to offer a method which eliminates the photolithography steps used in the prior art.

SUMMARY OF THE INVENTION

Thus the invention relates to a method for manufacturing chips consisting of at least one electrically conductive material, from an alloy composed of at least this first material and at least one second material.

For a better understanding and, in the rest of the description, the first electrically conductive material is denoted (A), the second material (B) and the alloy (AB). The term alloy is appropriate insofar as the mixed material AB comprises at least one metal.

More precisely, such a method comprises the following steps: deposition, on a support, of the alloy (AB) comprising at least the first (A) and the second material (B); exposure of this alloy (AB) to a plasma etching, in order to cause the desorption of the elements, with the exception of at least the electrically conductive material (A).

More precisely, "elements" means the materials of the alloy not forming part of the composition of the chips, in this case the second material (B). On the contrary, the electrically conductive material (A) constituting the chips must not be desorbed.

On completion of this method, chips are formed on the substrate, composed of materials of the alloy not having been desorbed, in this case the electrically conductive material (A).

In a preferred embodiment, the alloy is a binary material consisting exclusively of A and B. Advantageously, the materials combined are selected from the elements in columns II and VI or in columns III and V of the Periodic Table respectively.

As already stated, the first material has the property of being electrically conductive. It is therefore a metal, or even a metalloid.

Advantageously, the electrically conductive material is indium (In) or gallium (Ga) which are classed in column III of the Periodic Table.

Thus, the preferable binary materials are InP or GaAs, in which the phosphorus (P) and arsenic (As), belonging to column V of the Periodic Table, are combined with the metal In and Ga, allowing the formation of chips of indium and gallium, respectively.

Another example of a preferred binary material is cadmium (Cd; column II of the Periodic Table) combined with tellurium (Te; column VI of the Periodic Table).

Alternatively, the alloy may be ternary or quaternary, comprising one or more electrically conductive materials. Thus, a material InAsP allows the formation of indium chips, whereas a quaternary material of the InGaAsP type yields chips composed either of only one of these two metals (In or Ga) or of an alloy of indium and gallium.

According to the invention, the electrically conductive material (A) for constituting the chip is therefore not deposited in its simple form as in the prior art, but in the form of an at least binary material (AB).

This alloy (AB) may, for example, be deposited by Chemical Vapor Deposition (CVD), advantageously at low temperature (between 100 and 250° C.) as reported in document U.S. Pat. No. 5,346,852.

In this case, the alloy has the form of a solid metal board.

Advantageously, the deposited alloy may be shaped by lithography followed by etching, before the plasma etching. Lithography is advantageously used with a fine resin and etching is chemical or dry. This alternative allows better control of any fluctuations in size of the chips formed, insofar as the quantity of material forming the chip is predefined.

In the context of the production of Anisotropic Conductive Films (ACF), metal connecting bumps are disposed on the support, before depositing the alloy. Advantageously, these bumps are spaced and are covered by the deposit. On completion of the second step, which is described in detail below, metal chips are therefore formed on the surface of these metal bumps, ensuring the connection with the metal bumps placed opposite.

In the context of the production of a field of flip-chips, metal bumps are also disposed on the support, with a spacing of between about 100 nanometers to a few microns. These bumps are intended to be covered by the deposit and are configured to allow the formation of only one flip-chip per bump. This depends in particular on the surface of the bump, and the quantity of alloy deposited.

In a subsequent step, the alloy is etched by plasma. The plasma etching is intended to remove alloy material. The conditions of this step are set in order to obtain:

a selective desorption of all the elements with the exception of the desired elements in the composition of the chip, in particular the electrically conductive material (A); the formation of chips using the electrically conductive material (A) having the desired characteristics, particularly size, thanks to its reorganization in spherical form on the surface.

The plasma etching step is advantageously carried out under a vacuum of about 2 to 50 mTorr, advantageously of about 10 mTorr.

The chemistry of this step, in particular the temperature and pressure conditions, and the composition of the gases constituting the plasma, are determined according to the elements present in the alloy, particularly A and B. The principle is that the element B placed in these conditions must desorb more easily than the other elements (in particular A) which constitute the chips.

In other words, the reaction product between the gas(es) and the second material must be more volatile than the electrically conductive material and even than the reaction product between the first material and the gas(es) forming the plasma.

By way of example, the alloy InP, in the presence of the gases $C_2H_4$ and $H_2$, forms highly volatile phosphine ($PH_3$). In similar conditions, the material GaAs leads to arsine ($AsH_3$), which is also highly volatile.

By varying the parameters of the inventive method, it is therefore possible, on completion of said method, to obtain flip-chips in a very wide range of sizes, ranging from about 10 microns to a few tens of nanometers. Significantly in comparison with the prior art (density of about $10^6$ chips/cm$^2$), it is therefore possible to obtain chips smaller than 10 microns in diameter, or even smaller than 3 microns, and having a high density, $10^7$ chips/cm$^2$ or more. Thus, the exemplary embodiments presented below show that with smaller chips, it is possible to obtain a density of $10^8$ chips/cm$^2$ or more.

In conclusion, the technical solution proposed in the context of the present application offers many advantages:

the possibility of forming micron-sized, or even nanometer-sized flip-chips, on the surface of a substrate without requiring any lithography;

the possibility of forming flip-chips with a high density on the surface of a substrate. The chips are clearly separated spatially in X and Y in the plane of the layers, allowing conduction exclusively in the Z direction or perpendicular to the plane of the layers;

the maximum temperature to which the substrate must be heated to obtain the flip-chips may be lower than with a "solid" material melting technique. In fact, the melting point of the metal particles decreases with the size of these particles. During the etching of the material AB, it is possible for particles A to be formed at nanometer scale, melting at a lower temperature than the melting point of solid A, coalescing better together to form larger particles having up to micron size. Thus, for the indium chips, it has been observed that the temperature indicators did not record temperatures higher than 130° C., whereas the melting point of indium is 157° C.

As already stated, the present invention has many advantageous applications:

production of Anisotropic Conductive Adhesives (ACA) or Anisotropic Conductive Films (ACF) having a very fine pitch;

hybridization by indium chips;

production of metal catalysts for nanowire growth;

production of metal nanoparticles for the field of plasmonics.

BRIEF DESCRIPTION OF THE DRAWINGS

The manner of implementing the invention and the advantages thereof will appear better from the exemplary embodiments that follow, provided for information and nonlimiting, in conjunction with the appended figures in which.

(1) (A) definition of metal connecting bumps;
(2) (B) deposition of the binary material AB by CVD;
(3) (C) plasma etching with a gas promoting the desorption of the element B;
(4) (D) opposite positioning of the element to be connected and application of a pressure;
(5) (E) connection completed.

Figure 9:
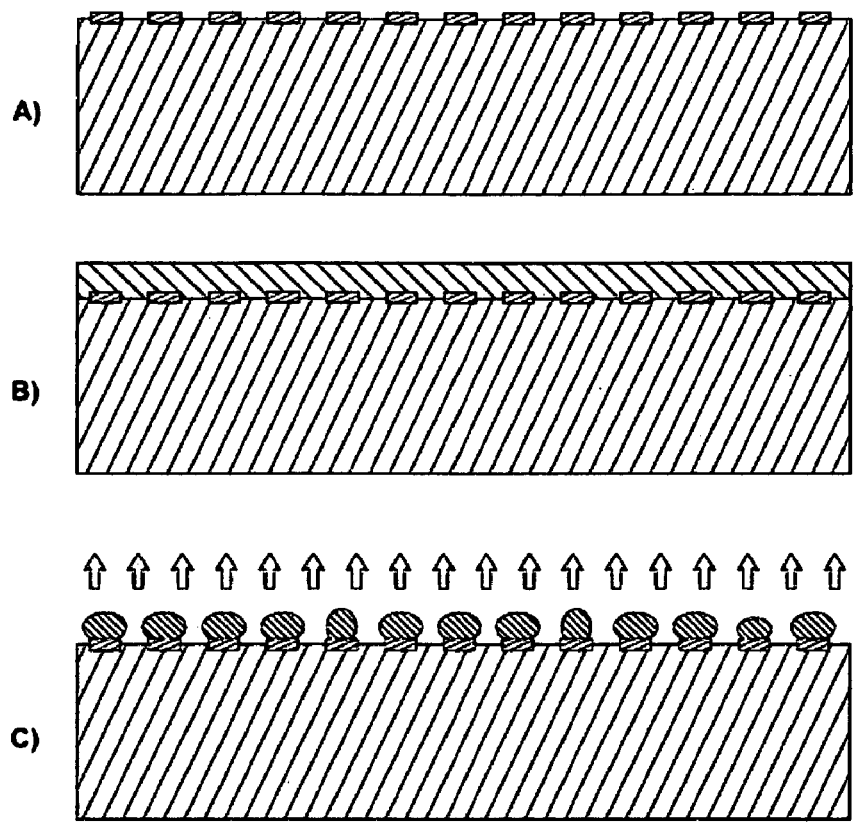

FIG. 9 shows the various steps of the inventive method employed to obtain flip-chips of element A from the binary B; (A) definition of metal bumps which receive the metal chips; (B) deposition of the binary material AB by CVD; (C) plasma etching with a gas promoting the desorption of the element B.

Figure 10:
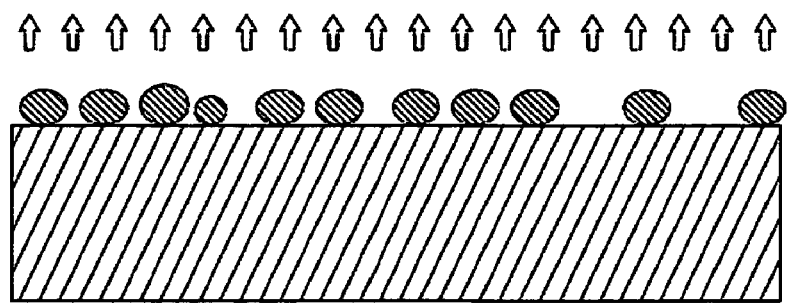

FIG. 10 shows a first alternative of the method in FIG. 9, in which there is no need for metal bumps to obtain the vertical conduction.

Figure 11:
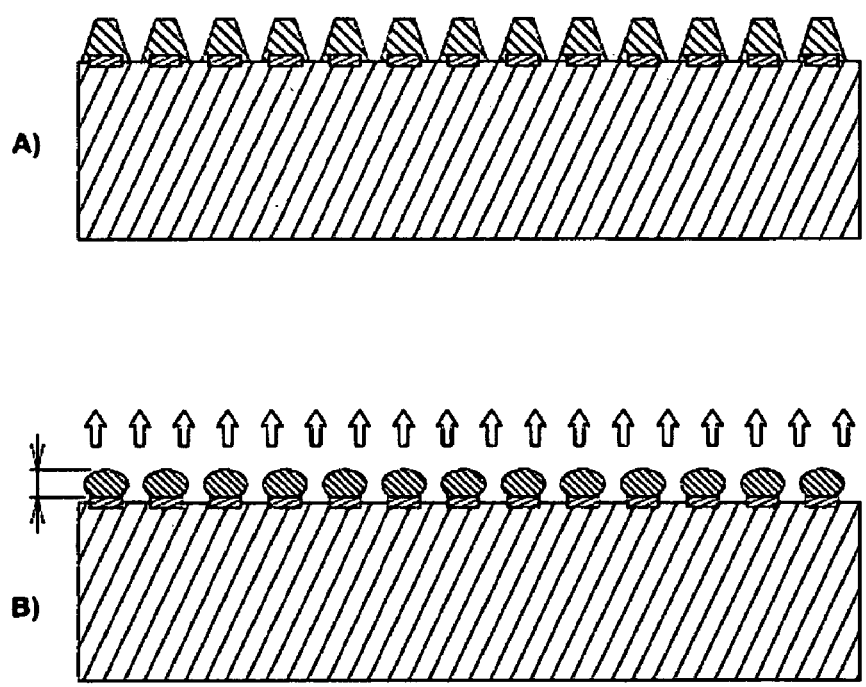

FIG. 11 shows a second alternative of the method of FIG. 9, allowing better control of the fluctuation in size of the chips, in which a lithography step with fine resin deposition and chemical or dry etching are implemented (A) before the plasma etching (B).

DETAILED DESCRIPTION OF THE INVENTION

Figure 4:
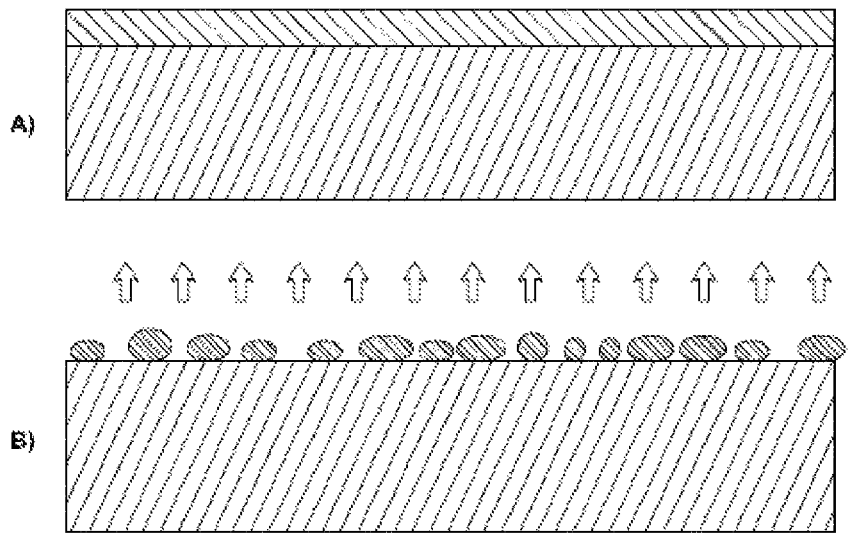
FIG. 4 shows the embodiment of indium chips according to the invention comprising a step of deposition of the material AB (A) followed by a step of desorption of B in parallel with the formation of chips of A (B).

The principle of the inventive method is illustrated in FIG. 4. The method for producing indium chips described in the present application involves two steps: deposition of the alloy AB (FIG. 4A); followed by desorption of the element B and, in parallel, the formation of chips of the element A (FIG. 4B).

Figure 5:
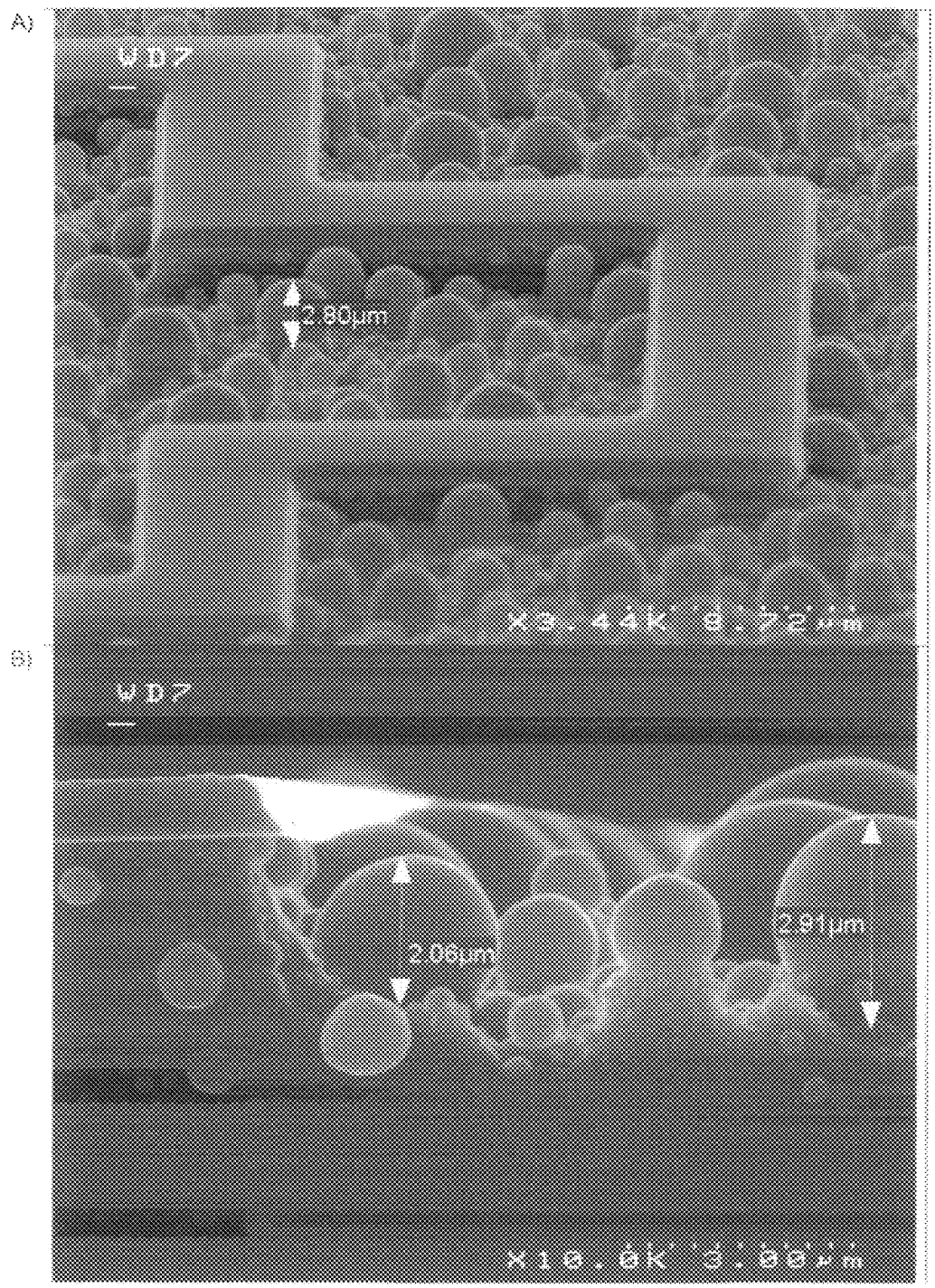
FIG. 5 shows plan (A) or profile (B) views taken by scanning electron microscope, showing the production of chips on the surface of a substrate of InP, after plasma etching; the chipless zone corresponds to the etching mask (nitride).

This solution is concretely illustrated in the scanning electron microscope image in FIG. 5. This image was obtained in connection with the production of chips of indium (In), which plays the role of element A here.

InP substrates (playing the role of the binary AB here), having a virtually infinite thickness of about 350 micrometers, were subjected to a plasma etching step in the presence of a $C_2H_4/H_2$ gas mixture, in an Inductively Coupled Plasma (ICP) etching frame. The gas flows were about 10 sccm for ethylene, 30 sccm for hydrogen, the pressure in the etching chamber was 10 mTorr, and the RF and LF powers were 200 W and 600 W, respectively.

The hydrogen, the predominant gas in the chamber, reacted preferably with phosphorus P to form highly volatile phosphine $PH_3$: the desorption of the phosphorus were therefore deliberately privileged, at low pressure and low temperature. The remaining indium was reorganized in the form of nanochips (2), having a lower melting point than the melting point of solid indium (157° C.). These nanotubes coalesced to form larger chips (FIG. 5).

Using this technique, it is therefore possible to obtain indium chips on the surface of a substrate without using the photolithography technique. Moreover, FIG. 5 shows that relatively small chip sizes can be obtained, ranging from 3 micrometers to some tens of nanometers.

Figure 6:
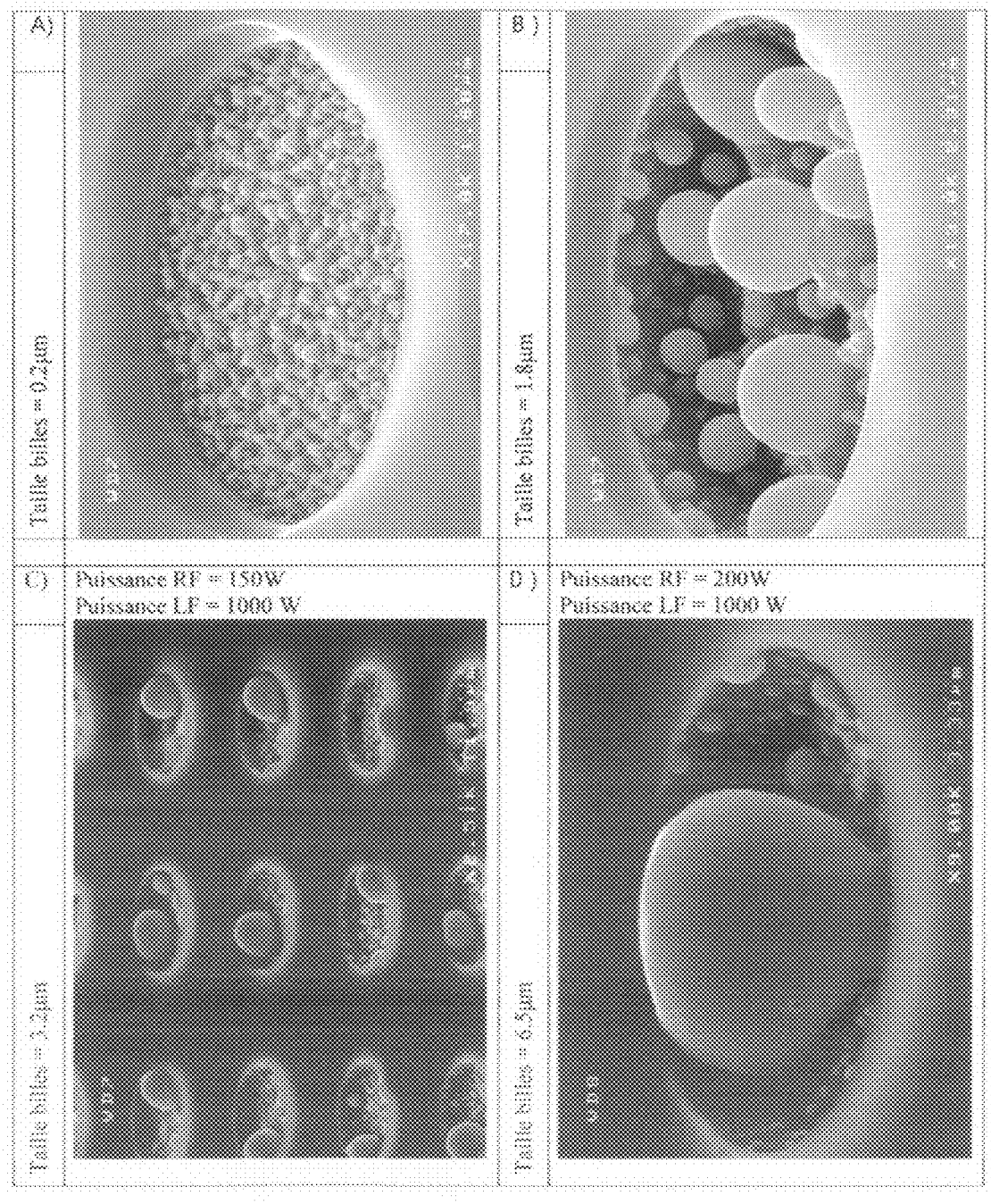
FIG. 6 corresponds to scanning electron microscope images which show that by varying the plasma conditions, chips of variable average size can be obtained (A: 0.2 µm; B: 1.8 µm; C: 3.2 µm; D: 6.5 µm).

FIG. 6 shows that the average size of these indium chips can be modified by varying the plasma conditions. InP substrates were exposed for 15 minutes to $C_2H_4/H_2$ plasmas (10 sccm/30 sccm) under a pressure of 10 mTorr in an ICP frame. By only varying the RF and LF powers, chip sizes of between 0.2 and 6.5 micrometers were obtained.

Figure 7:
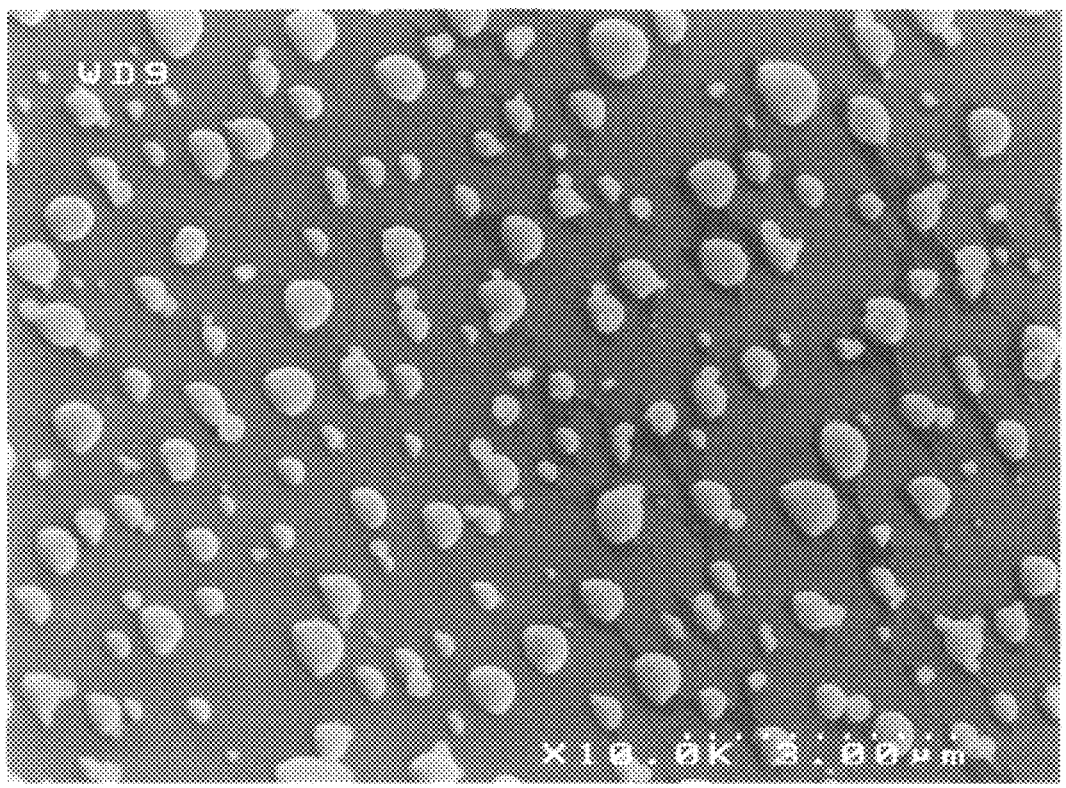
FIG. 7 corresponds to an image obtained by scanning electron microscope of In chips having a diameter of about 300 nanometers obtained by the inventive method from a 3 µm layer of InP bonded to silicon via a layer of silica.

FIG. 7 shows the result of the plasma etching of an InP layer having a finished thickness of 3 micrometers, bonded on silicon via a layer of silica: the uniformity of chip size is better compared with the etchings presented previously, with chip diameters ranging from 200 to about 500 nanometers for the plasma conditions employed. The chip density is about $10^8/cm^2$.

Figure 8:
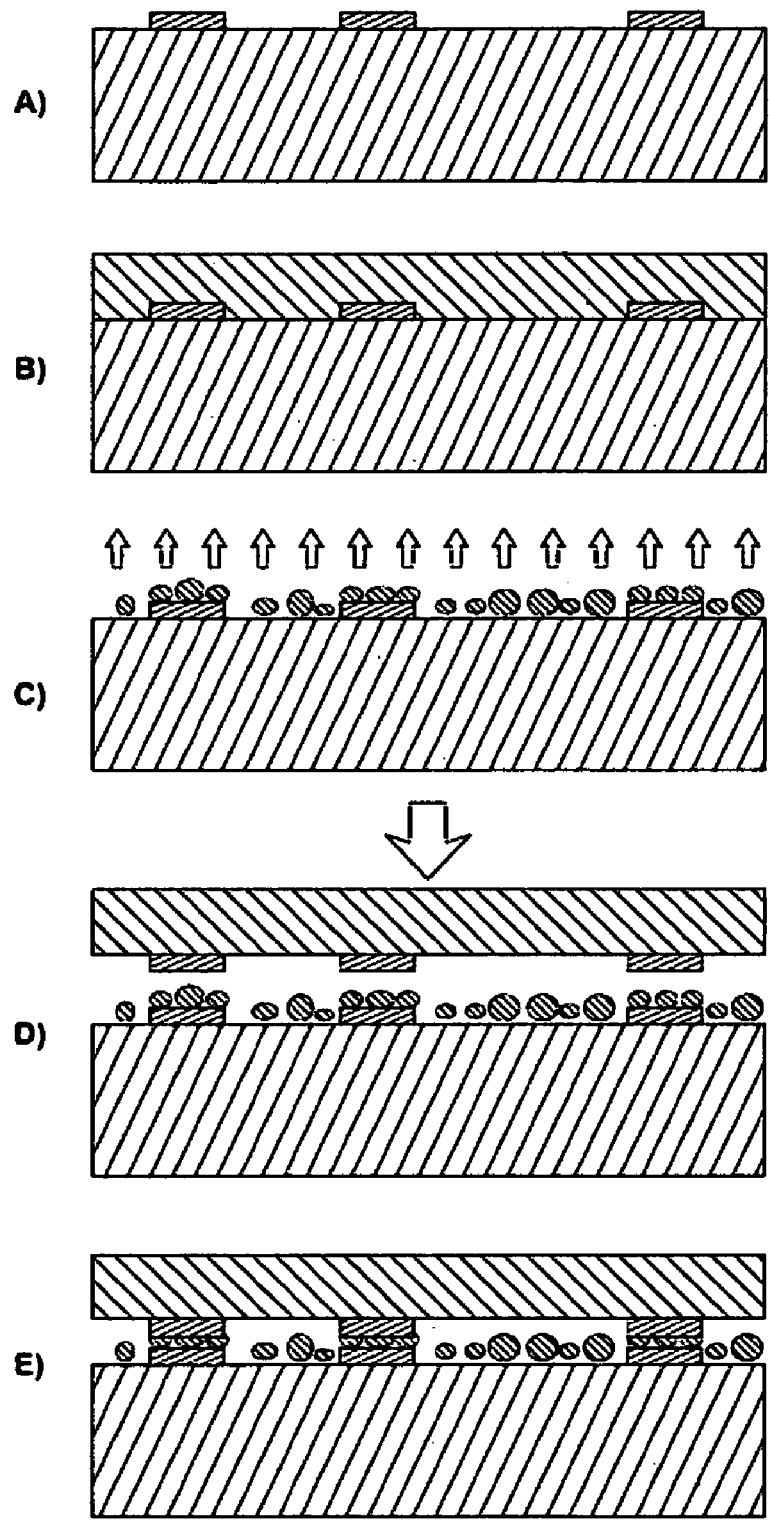
FIG. 8 shows the various steps of the inventive method implemented for the interconnection of circuits with a very fine chip pitch.

As already stated, a first application of the chips obtained by the method relates to the production of Anisotropic Conductive Films (ACF). An embodiment adapted for this application is illustrated in FIG. 8 and permits the interconnection of circuits with a very fine chip pitch.

This figure illustrates the steps upstream and downstream of the inventive method: definition of metal connecting bumps (FIG. 8A); deposition of the binary material AB by CVD (FIG. 8B); plasma etching with a gas promoting the desorption of the element B (FIG. 8C); opposite positioning of the element to be connected and application of a pressure (FIG. 8D) culminating in connection (FIG. 8E).

Figure 1:
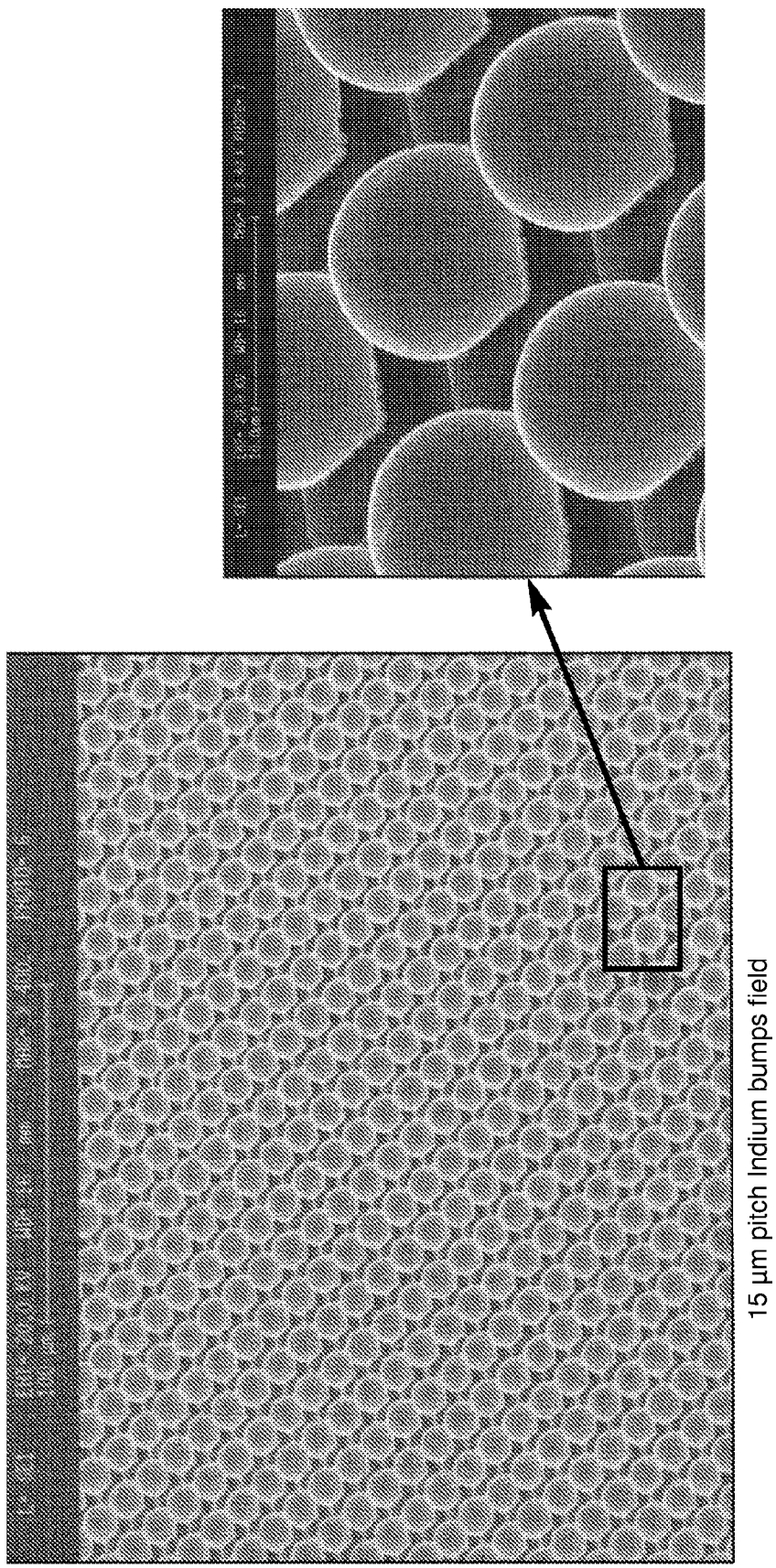
FIG. 1 is a scanning electron microscope image showing the indium chips for the flip-chip.
Figure 2:
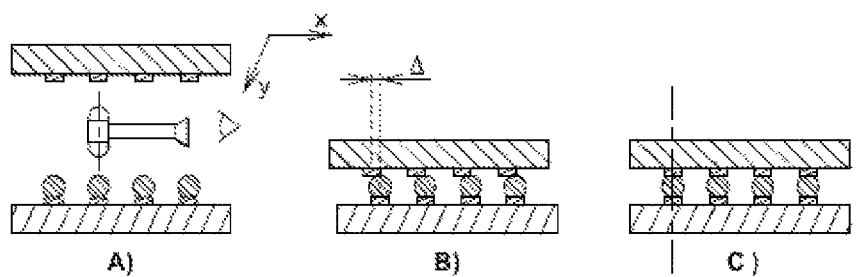
FIG. 2 is a schematic showing the self-alignment permitted by the flip-chip technique by indium chips, thanks to the steps of visual alignment (A), placement and heating (B), followed by a self-alignment (C).
Figure 3:
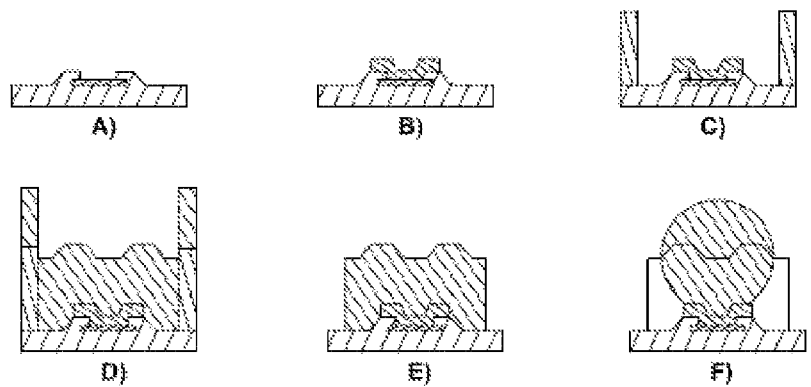
FIG. 3 shows the embodiment of the indium chips according to the prior art: (A) reception of the read circuit; (B) weld metallurgy; (C) photolithography defining the volume of indium; (D) indium deposition; (E) photoresist resin lift-off; (F) indium remelt.

A second field of application is the production of a field of flip-chips, uniformly spaced, but with a finer pitch than with the lift off technique currently used and as shown in FIG. 1.

In this context, one possible embodiment, based on the inventive method, is described in FIG. 9. Apart from the two characteristic steps of the inventive method, a prior step consists in defining metal bumps intended to receive the metal chips. These bumps are advantageously spaced by a few hundred nanometers to a few microns. Owing to the size of these bumps, a single chip is formed per bump on completion of the method.

One alternative of this embodiment, proposed in FIG. 10, consists in avoiding metal bumps for vertical conduction. According to the very concept of the inventive method, the chips can be formed anywhere on the substrate, culminating in a high density.

For better control of the chip size uniformity, and for a certain range of chip diameters over one micron, it is possible to implement another alternative shown in FIG. 11. This consists in carrying out a step of lithography+etching of the material AB, before the plasma etching which forms the chips. However, this alternative has the drawback of being more cumbersome in terms of technologies employed.

REFERENCES

Kristiansen Helge et Liu Johan, "*Overview of conductive Adhesive Interconnection Technologies for LCD's*", IEE transactions on components, packaging, and manufacturing technology, part A, Vol. 21, N° 2, June 1998, pp 208-214.

Coombes C. J., "*The melting of small particles of lead and indium*", J. Phys. F: Metal Phys., Vol. 2, May 1972, pp 441-449.

We claim:

1. A method for manufacturing chips composed of at least one electrically conductive material, the method comprising:
   depositing, on a support, an alloy comprising at least the electrically conductive material and a second material;
   exposing the alloy to plasma etching, in order to cause the desorption of the materials of the alloy not forming part of the composition of the chips, that is at least the second material but not the electrically conductive material; and
   forming chips composed of at least said electrically conductive material.

2. The chip manufacturing method as claimed in claim 1, wherein the first electrically conductive material and the second material are selected from the elements in columns II and VI or in columns III and V of the Periodic Table respectively.

3. The chip manufacturing method as claimed in claim 2, wherein the first electrically conductive material is indium (In), gallium (Ga) or cadmium (Cd), and the second material is phosphorus (P), arsenic (As), or tellurium (Te).

4. The chip manufacturing method as claimed in claim 1, wherein the alloy is ternary or quaternary, comprising one or more electrically conductive materials.

5. The chip manufacturing method as claimed in claim 1, wherein the alloy is deposited on the support by chemical vapor deposition (CVD).

6. The chip manufacturing method as claimed in claim 1, wherein the alloy deposited on the support is shaped by lithography and etching, before exposure to the plasma etching.

7. The chip manufacturing method as claimed in claim 1, wherein the plasma etching step is carried out under a vacuum of about 2 to 50 mTorr.

8. The chip manufacturing method as claimed in claim 7, wherein the plasma etching step is carried out under a vacuum of about 10 mTorr.

9. The chip manufacturing method as claimed in claim 1, wherein the gases forming the plasma in the plasma etching step are ethylene ($C_2H_4$) and hydrogen ($H_2$).

* * * * *